United States Patent [19]

Tavis et al.

[11] Patent Number: 5,293,137
[45] Date of Patent: Mar. 8, 1994

[54] DIGITAL TRANSDUCER SYSTEM INCLUDING TWO REACTIVE TRANSDUCERS FORMING RESONANT OSCILLATOR CIRCUITS

[75] Inventors: John R. Tavis, Mariposa; Laurence R. Nicholson, Nevada City, both of Calif.

[73] Assignee: Tavis Corporation, Mariposa, Calif.

[21] Appl. No.: 888,768

[22] Filed: May 26, 1992

[51] Int. Cl.$^5$ .................. H03B 5/12; G01L 7/08; G01L 9/10
[52] U.S. Cl. .................. 331/49; 73/717; 73/723; 324/207.16; 324/207.18; 331/65; 331/109; 331/117 R; 331/173; 331/183; 340/626
[58] Field of Search .............. 331/49, 65, 109, 117 R, 331/173, 183; 73/717, 723, 724; 324/207.16, 207.17, 207.18, 327, 328; 340/626

[56] References Cited

U.S. PATENT DOCUMENTS 4,536,719 8/1985 Baum et al. .................. 331/65 X
5,079,523 1/1992 Kleinhaus .................. 331/65

Primary Examiner—Siegfried H. Grimm
Attorney, Agent, or Firm—Christie, Parker & Hale

[57] ABSTRACT

A variable reluctance transducer system incorporating digital control of parallel resonant circuits including two inductive sensors L1 and L2 on each side of a flat diaphram. The dual variable reluctance elements provide dual frequency signals for digital calculation to obtain a quotient of the frequencies, thereby substantially eliminating the resonant frequencies as a variable in the accuracy of the device. Manipulation of the produced quotient by a micro-controller 10 employing digital calibration tables stored in a programmable read only memory 14 allows calibration reponsive to a temperature sensor 16, thereby substantially eliminating temperature induced errors in the system, further increasing accuracy.

6 Claims, 2 Drawing Sheets

DIGITAL TRANSDUCER SYSTEM INCLUDING TWO REACTIVE TRANSDUCERS FORMING RESONANT OSCILLATOR CIRCUITS

BACKGROUND OF THE INVENTION

1. Field of the Invention

The present invention applies generally to variable reluctance transducers employing parallel resonant circuits producing signals for manipulation to represent the input to the transducer with an output value. Specifically, the present invention employs digital control of parallel resonant circuits incorporating variable reluctance elements acting as the force sensor in the transducer providing dual frequency signals for digital calculation to obtain a quotient of the frequencies thereby substantially eliminating the resonant frequencies as a variable in accuracy of the device. Manipulation of the produced quotient through digital calibration tables responsive to a temperature sensor produces an output value which substantially eliminates temperature-induced errors in the system and further increases accuracy.

2. Prior Art

Variable reluctance transducers have been in use for a number of years in the measurement of physical parameters which can be resolved into force on a diaphragm. Displacement or deformation of the diaphragm due to the force which may be fluid pressure, acceleration or other physical phenomenon exerted on the diaphragm provides a basis for measurement. An inductor or capacitor mounted to the diaphragm changes value based on the displacement or deformation. Incorporation of the inductor or capacitor in a resonant circuit allows measurement of the deformation by change in frequency. The use of two variable reluctance elements to produce two separate frequencies based on deformation of the diaphragm provides a basis for calibrating and correcting the measured value. Integration of both variable reluctance elements with the diaphragm to produce opposite variation of the parameter value or fixed mounting of one element for comparison with the element mounted to the diaphragm allows calibration through various combinations of the two frequencies produced. U.S. Pat. No. 3,140,450 entitled "Force Controlled Variable Reactance Transducer," issued on Jul. 7, 1964 to the inventor of the present application discloses the structure of such a transducer wherein the frequencies produced by the two resonant circuits are mixed to obtain a difference frequency for measurement of the force applied to the diaphragm.

Calibration and compensation of variable reluctance transducers has been accomplished in the prior art through the design of the oscillator circuit provided to drive the variable reluctance resonant circuit of the transducer. Various means to provide constant amplitude signals for increased accuracy of measurement are disclosed in various prior art patents such as U.S. Pat. Nos. 3,763,444, 3,837,227 and 4,947,139, all issued to the inventor of the present application.

While significant accuracy improvements have been made in variable reluctance transducers, the inaccuracies caused by nonlinearity in deformation characteristics of the diaphragm, influence of temperature on the diaphragm characteristics and electronic components, and conversion of the data produced by the transducer to usable form continue to require creative solutions.

The present invention provides a novel oscillator circuit for control of switchable dual resonant circuits for a variable reluctance transducer in combination with a digital control system for accurate conversion of the raw transducer signal and to provide a digital output of desired form allowing easy analysis and manipulation of the data produced.

SUMMARY OF THE INVENTION

The digital transducer system of the present invention receives a force input on the diaphragm of the transducer. A first resonant circuit incorporating either a variable inductor or a variable capacitor is activated by a first control signal producing a first frequency dependant on the force input to the transducer. A second resonant circuit incorporating a variable or fixed element comparable to the first resonant circuit is activated by a second control signal to produce a second resonant frequency. If the element in the second resonant circuit is variable, the second frequency is similarly dependent on the transducer force input. A microcontroller is employed to produce the first and second control signals. The control signals are asserted on a mutually exclusive basis to allow use of a common resonant element by the two resonating circuits. The microcontroller also incorporates a frequency measurement circuit connected to the first resonating circuit and second resonating circuit for measurement of the first resonant frequency and second resonant frequency when activated by the first and second control signal respectively. The microcontroller divides the first frequency by the second frequency to create a quotient representative of the force on the transducer and calculates a raw parameter based on the quotient. A table lookup conducted by the microcontroller in a programmable read-only memory based on the raw parameter value provides a calibrated value for the parameter measured by the transducer. Use of a lookup table for calibration allows compensation for nonlinearities in the diaphragm, and a temperature sensor is employed to provide input to the microcontroller for use in combination with the raw parameter data to produce the input parameter employed by the microprocessor for the lookup table.

Control of the resonant circuits is provided by an oscillator circuit incorporating an amplifier receiving an output from the first and second resonant circuit as an input and providing the output of the resonant frequency to the microcontroller. The output of the amplifier is also provided to a detector for conversion to a DC signal which is compared to a reference voltage through a diode chopper operating at the oscillator's frequency. The signal generated by the chopper is returned as a feedback signal to the resonant circuits to maintain the oscillation. The feedback signal is proportional to the difference between the detected signal and the reference voltage.

DESCRIPTION OF THE DRAWINGS

The features of the present invention may be more clearly understood by description with reference to the following drawings.

DETAILED DESCRIPTION

Figure 1:
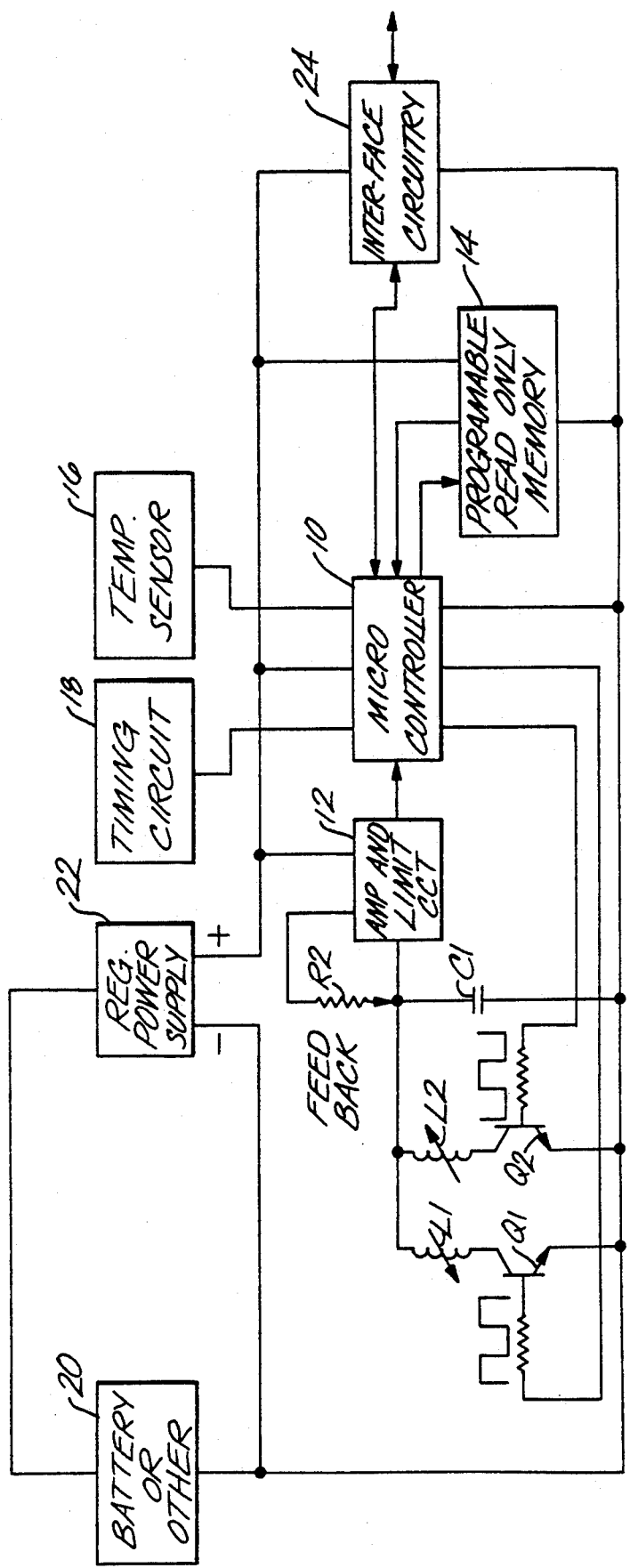
FIG. 1 is a block diagram showing the interrelationship of the elements of the present invention.

Referring to FIG. 1, a force gauge is created by placing two inductive sensors L1 and L2 on each side of a flat diaphragm (not shown). The inductance of each sensor is inversely proportional to the distance from a front open face to the diaphragm, thereby creating a variable inductor. A force applied to one side of the diaphragm, such as a fluid pressure, will cause the diaphragm to deform, moving toward one sensor and away from the other sensor. Inductance of one sensor is thereby increased, while inductance of the other sensor is decreased. A capacitor C1 is connected across the variable inductors to form a resonant circuit with each inductor. A switching transistor Q1 is inserted in the first resonant circuit with inductor L1, and a switching transistor Q2 is inserted in the circuit with inductor L2. Turning transistor Q2 off and transistor Q1 on allows the first resonant circuit to oscillate while disabling the second resonant circuit. Switching transistor Q1 off and transistor Q2 on conversely allows the second resonant circuit to oscillate.

Alternate embodiments of the present invention employ variable capacitors associated with the diaphragm and a fixed single inductor as a replacement for capacitor C1 to form the resonant circuits. In addition, a fixed value component may be substituted for one of the variable components in one of the resonant circuits to provide a fixed frequency reference for the variable frequency resonant circuit.

The gate of transistor Q1 is connected to a first control signal provided by a microcontroller 10 while the gate of transistor Q2 is connected to a second control signal from the microcontroller. The microcontroller asserts the first and second control signals alternately for activating the first and second resonant circuit. This allows a single capacitor to be used as the second element of both resonant circuits, thereby increasing the accuracy of the transducer.

The two resonant circuits are connected through an amplifier and limit circuit 12 which provides control of the oscillator alternately formed with each of the two resonant circuits. Feedback from the amplifier and limit circuit through resistor R2 maintains the oscillation and controls the amplitude of the oscillation. The frequency of the active resonant circuit is provided from the amplifier and limit circuit to the microcontroller. A counter in the microcontroller determines the frequency of the selected resonant circuit which is stored by the microcontroller. Alternating of the first and second control signals allows frequencies for both resonant circuits to be determined. The microcontroller calculates the quotient of the frequencies of the first and second resonant circuits. Using pressure as an example of the parameter measured by the transducer, the frequency of the first resonant circuit F1 and the frequency of the second resonant circuit F2 are defined by the equations $$F1 = 1/(2 * \pi * (L1 * C)^{\frac{1}{2}}$$

$$F2 = 1/(2 * \pi * (L2 * C)^{K}$$

$$L1 = K\ G1$$

$$L2 = K\ G2$$

where L1 is the inductance of inductor L1, and L2 is the inductance of inductor L2. K is a numerical constant, and G1 is the air gap between the diaphragm and the first inductor, and G2 is the air gap between the diaphragm and the second inductor.

If G0 equals the initial air gap, then $$G1 = G0 + N * G0 = G0(1 + N)$$

$$G2 = G0 - N * G0 \cdot G0(1 - N)$$

where N is the per unit motion of the diaphragm's initial air gap G0 and N is proportional to the pressure P which is applied to the diaphragm. K1 is a second numerical constant. Taking the quotient of the frequencies and substituting from the above equations, the value for capacitance drops out of the equations and $$\begin{aligned}
L1/L2 &= G2/G1 \\
&= (1 - N)/(1 + N) \\
F1/F2 &= (L2/L1)^{\frac{1}{2}} \\
&= ((1 + N)/(1 - N))^{\frac{1}{2}} \\
(F1/F2)^2 &= (1 + N)/(1 - N) \\
N &= ((F1/F2)^2 - 1)/((F1/F2)^2 + 1)
\end{aligned}$$

therefore, an equation for the raw pressure data is $$P = (1/K1) * ((F1/F2)^2 - 1)/((F1/F2)^2 + 1)$$

Variation of the linearity in the diaphragm and changes in capacitance and inductance due to temperature of the circuits is compensated in the present invention through the use of lookup tables stored in a programmable read-only memory 14. A temperature sensor 16 located adjacent the diaphragm provides temperature data to the microcontroller. The raw pressure data is combined with the temperature data in the microcontroller to provide a value for the lookup table. Interpolation between calibration points in the matrix stored in the lookup table is made by the microcontroller. Use of the calibration matrix in the lookup table compensates for temperature, nonlinearities of the diaphragm at large excursions, imperfect inductors, leakage flux and any current losses and nonlinearities of the circuit. By solving the equation for the raw pressure data in the microcontroller, the interpolative intermediate points in the calibration matrix are much closer. A minimum of calibration input data significantly improves the accuracy of the transducer over direct conversion of the raw pressure data to a calibrated pressure output.

A calibration matrix for an embodiment of the present invention comprises approximately 5 to 10 pressure data points taken over 5 or 10 temperatures between −55° C. to +150° C. This produces a three-dimensional matrix of approximately 25 to 100 discrete data points. The microprocessor selects points in the calibration matrix based on the raw input from the transducer and the input from the temperature sensor. Interpolation between the two points performed by calculation in the microcontroller provides the final data output value. Linearity between the points in the matrix is required for the best accuracy of the system; however, no requirement is present that the points in the calibration matrix be at equally spaced values. Consequently, for example, in compensating for nonlinearities in the diaphragm, widely spaced points may be used through the region of limited displacement of the diaphragm, with spacing of calibration points in the matrix becoming increasingly closer in value at extended distances of travel or deformation of the diaphragm.

Figure 2:
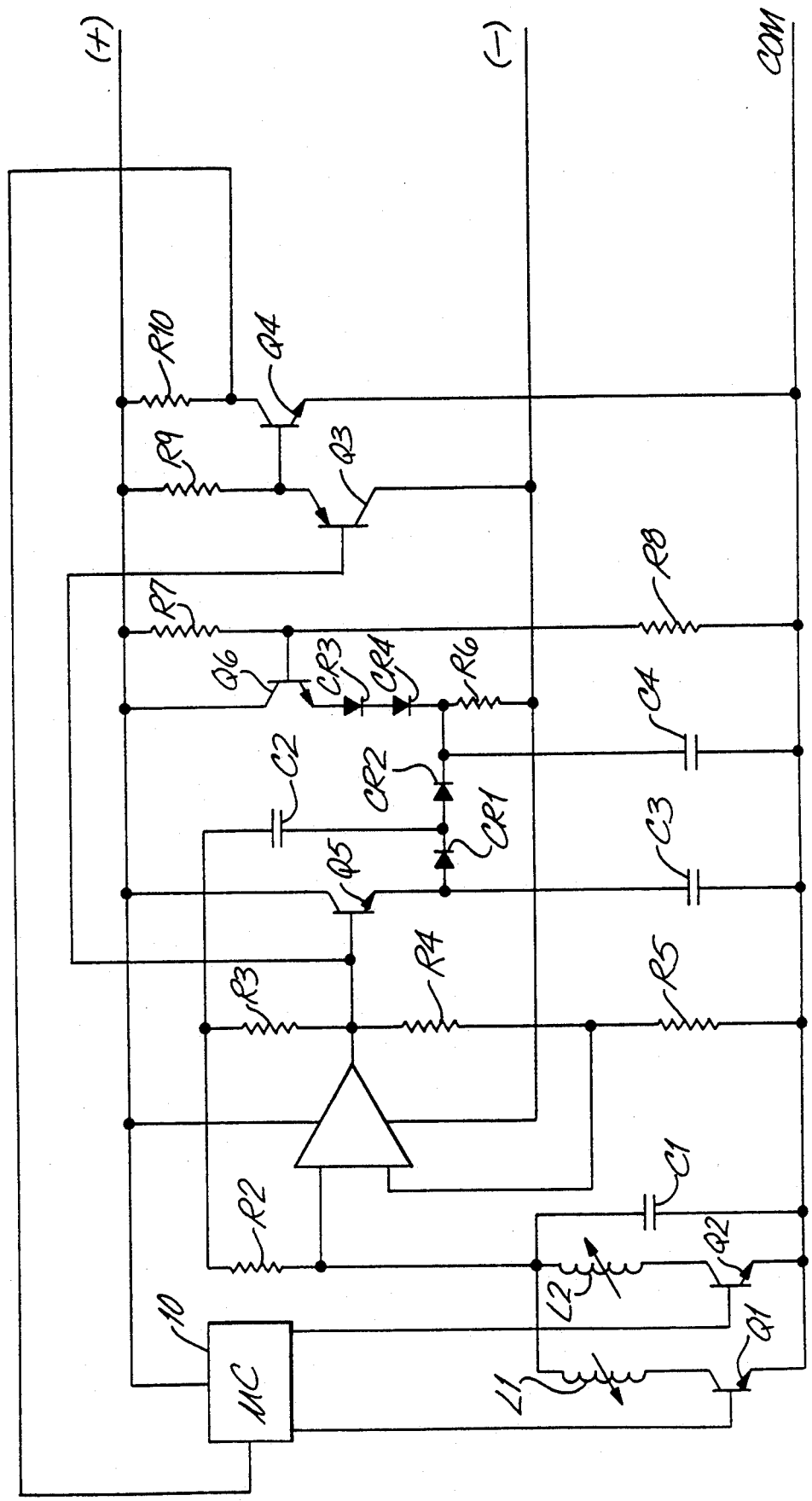
FIG. 2 is a schematic diagram of the oscillator control circuit for the present invention.

Control of the resonant circuits to provide a constant amplitude signal to the microprocessor is accomplished in the amplitude and limit circuit 12. As best seen in FIG. 2, the parallel resonant circuits provide an output which is connected to amplifier U1. The output of amplifier U1 is provided through a second stage comprising transistors Q3 and Q4 to the microcontroller. The second stage of the amplifier provided by transistors Q3 and Q4 provides a squaring circuit for the sine wave output produced by amplifier U1. The square wave input provides more accurate triggering of the counting circuits in the microcontroller.

The output of amplifier U1 also is provided to transistor Q5 for detection of the signal level. Transistor Q6 provides a reference for detection of the signal from the resonant circuits. Resistors R7 and R8 establish the reference level at approximately 2.5 VDC for a ±5-volt system. Resistors R4 and R5 provide negative feedback for control of the gain of amplifier U1. Resistor R3 drives the resonant signal through capacitor C2 into chopper diodes CR1 and CR2. A positive AC signal from the resonant circuit results in conduction by CR2 at the voltage established by transistor Q6. A negative AC signal causes diode CR1 to conduct limiting the feedback signal provided through resistor R2 to the resonant circuit. At small oscillation amplitudes in the resonant circuit, the feedback signal through resistor R2 as driven by the reference transistor Q6 is large due to a lack of a substantial DC level on the signal output from amplifier U1. As the oscillation amplitude increases in the resonant circuits, the feedback is reduced to a level only sufficient to maintain oscillation when the detected signal from amplifier U1 is substantially equal to the reference voltage.

Diodes CR3 and CR4 are provided on the emitter of transistor Q6 for temperature compensation. Capacitors C3 and C4 provide filtering for the circuit. Resistor R6 is the load resistor for transistor Q6.

In a preferred embodiment of the present invention, the microcontroller employed is a National Semiconductor COP888CGMH single chip micro CMOS micro controller. This device incorporates an erasable, programmable, read-only memory (EPROM) on the single chip with the microcontroller. As shown in FIG. 1, a timing circuit 18 comprising a crystal oscillator provides basic clocking for the microcontroller. Power for the transducer system is provided by a battery or other power source 20 through a regulated power supply 22.

Incorporation of the microcontroller in the present invention allows great flexibility for the applications in which the invention is used. The microcontroller provides a digital output corresponding to the corrected and calibrated transducer value for pressure or other measured parameter. This value is provided through standard interface circuitry 24 to data acquisition or transmission devices.

The interface circuitry provides communication with the system through standard serial interfaces or an SDI 12 which is incorporated within a telemetry system for control of the digital transducer system and transmission of data from the system. The format of the data output from the digital transducer system is determined by the programming of the microcontroller. Calculations based on the raw input data can be manipulated from a pressure input as an example to a flow input based on pressure drop in a venturi tube. Such an application may be used for water flow rate or air speed. Raw pressure data may be converted to altitude information or barometric pressure at fixed altitude for weather measurement. Incorporation of time into the equation through the timing circuit used with the microcontroller allows calculation of additional variable rates of pressure change such as a variometer for rate of climb or descent.

As exemplary of an implementation of the system, the digital transducer system in combination with an SDI 12 system with telemetry from a satellite connecting to central ground control is mounted in a self-contained package including a battery for operational power. Control of the entire system by the microcontroller allows maintaining of the system in a stand-by mode for minimum power consumption until telemetered "wake-up" instructions are received through the SDI 12 system. The microcontroller activates the transducer by application of the first and second control signals to obtain data, as previously described, which is then provided to the SDI 12 system for telemetry to the satellite and hence the central ground control. Interrogation of the system is only required for one second or so, thereby providing significant potential life for operation. Use of this system in a pressure-measurement application can provide pressure measurement in lakes and, by way of calculated flow rate based on static pressure, the flow of streams in remote areas. The information obtained from remote locations is telemetered through the satellite to a central location for analysis. A simple, cost-effective, stand-alone system is obtained.

Having described the invention in detail as required by the patent statutes, those skilled in the art will recognize alterations and substitutions for the elements of the inventions for specific embodiments. Such modifications and substitutions are included within the intended scope of the invention as defined by the following claims.

What is claimed is:

1. A digital transducer system receiving a force input, the system comprising:
    a first resonant circuit activated by a first control signal and having a first variable resonant frequency dependant on the force input;
    a second resonant circuit activated by a second control signal;
    a means for producing the first control signal and the second control signal at predetermined times;
    a means for frequency measurement connected to the first resonant circuit and second resonant circuit;
    means for calculating a quotient of the first frequency and second frequency;
    means for calculating a transducer value proportional to the quotient;
    means for calibrating the transducer value to provide a system output; and
    oscillator control means receiving a frequency signal from the first and second resonant circuits, when activated, for providing feedback to the first and second resonant circuits to maintain constant amplitude oscillation.

2. A digital transducer system as defined in Claim 1 wherein the second resonant circuit has a second variable resonant frequency dependent on the force input.

3. A digital transducer as defined in Claim 1 wherein the oscillator control means comprises:
    an amplifier receiving the frequency signal from the first and second resonant circuits;
    a detector receiving an output from the amplifier;

a chopper receiving as a first input an output from the detector;

a reference means for providing a voltage reference for the detector, the reference means having an output connected as a second input to the chopper; and feedback means receiving the output from the chopper and connected to the resonant circuits.

4. A digital transducer system as defined in claim 3 wherein the detector comprises a first transistor receiving as a control input the output of the amplifier and having an emitter output and wherein the reference means comprises a second transistor receiving a reference voltage at a control input and having an emitter output and wherein the chopper comprises a first diode connected to the emitter of the first transistor, a second diode connected in series to the first diode and connected with the emitter of the second transistor to a load resistor and wherein the feedback means comprises a capacitor connected at one terminal intermediate the first and second diode, the capacitor connected in series with a feedback resistor connected to the resonant circuit.

5. An oscillator controller for use in a digital transducer system having parallel resonant circuits, the controller comprising:

an amplifier receiving the frequency signal from the first and second resonant circuits;

a detector receiving an output from the amplifier;

a chopper receiving as a first input an output from the detector;

a reference means for providing a voltage reference for the detector, the reference means having an output connected as a second input to the chopper; and feedback means receiving an output from the chopper and connected to the resonant circuits.

6. A controller as defined in claim 5 wherein the detector comprises a first transistor receiving as a control input the output of the amplifier and having an emitter output and wherein the reference means comprises a second transistor receiving a reference voltage at a control input and having an emitter output and wherein the chopper comprises a first diode connected to the emitter of the first transistor, a second diode connected in series to the first diode and connected with the emitter of the second transistor to a load resistor and wherein the feedback means comprises a capacitor connected at one terminal intermediate the first and second diode, the capacitor connected in series with a feedback resistor connected to the resonant circuit.

* * * * *

UNITED STATES PATENT AND TRADEMARK OFFICE
CERTIFICATE OF CORRECTION

PATENT NO. : 5,293,137
DATED : March 8, 1994
INVENTOR(S) : John R. Tavis; Laurence R. Nicholson It is certified that error appears in the above-indentified patent and that said Letters Patent is hereby corrected as shown below:

Column 3, line 61, change "$F2=1/(2^*\pi^*(L2^*C)^k$" to
-- $F2=1/(2^*\pi^*(L2^*C)^{1/2}$ --.

Column 4, line 7, change "$G2=G0-N^*G0'G0(1-N)$" to
-- **$G2 = G0-N*G0 = G0(1-N)$** --

Signed and Sealed this

Fifth Day of December, 1995

Attest:

BRUCE LEHMAN

*Attesting Officer*  *Commissioner of Patents and Trademarks*